United States Patent
Lee et al.

(10) Patent No.: US 11,871,636 B2
(45) Date of Patent: Jan. 9, 2024

(54) DISPLAY DEVICE

(71) Applicant: Samsung Display Co., Ltd., Yongin-si (KR)

(72) Inventors: Sangshin Lee, Yongin-si (KR); Sanghoon Kim, Yongin-si (KR); Jongdae Lee, Yongin-si (KR); Sangmin Yi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 440 days.

(21) Appl. No.: 17/009,331

(22) Filed: Sep. 1, 2020

(65) Prior Publication Data
US 2021/0249482 A1    Aug. 12, 2021

(30) Foreign Application Priority Data
Feb. 12, 2020   (KR) ................. 10-2020-0017140

(51) Int. Cl.
*H10K 59/35*    (2023.01)
*H10K 59/123*   (2023.01)

(52) U.S. Cl.
CPC ......... *H10K 59/353* (2023.02); *H10K 59/123* (2023.02); *H10K 59/352* (2023.02)

(58) Field of Classification Search
CPC ............ H01L 27/3216; H01L 27/3218; H10K 59/122; H10K 59/35; H10K 59/352; H10K 59/353; H10K 59/121
See application file for complete search history.

(56) References Cited

U.S. PATENT DOCUMENTS

| | | | |
|---|---|---|---|
| 8,183,768 B2 | 5/2012 | Ko | |
| 8,881,676 B2 | 11/2014 | Hong | |
| 10,312,295 B2 | 6/2019 | Matsueda | |
| 2011/0180825 A1* | 7/2011 | Lee | H01L 27/3218 257/89 |
| 2018/0254306 A1* | 9/2018 | Matsueda | H01L 27/3218 |
| 2020/0035156 A1 | 1/2020 | Yanase et al. | |

FOREIGN PATENT DOCUMENTS

| | | |
|---|---|---|
| CN | 108010934 | 5/2018 |
| JP | 6566289 | 8/2019 |
| KR | 10-1065314 | 9/2011 |
| KR | 10-2016-0018936 | 2/2016 |
| KR | 10-1820020 | 1/2018 |
| KR | 10-2042527 | 11/2019 |
| KR | 201902125551 | * 11/2019 |

OTHER PUBLICATIONS

Extended European search report for European Patent Application or Patent No. 21156111.3 dated Jun. 11, 2021.

* cited by examiner

*Primary Examiner* — Thanhha S Pham
(74) *Attorney, Agent, or Firm* — KILE PARK REED & HOUTTEMAN PLLC

(57) ABSTRACT

A display device includes a substrate, and an array of pixels on the substrate, the array of the pixels including a first column in which first pixels emitting first color light and second pixels emitting second color light are alternately disposed in a first direction, and a second column adjacent to the first column. The second column includes third pixels that emit third color light and are disposed in the first direction. The second column includes groups each including two or more third pixels, and a first distance between adjacent third pixels included in a same group is less than a second distance between adjacent third pixels included in different groups.

26 Claims, 13 Drawing Sheets

DISPLAY DEVICE

CROSS-REFERENCE TO RELATED APPLICATIONS

This application claims priority to and benefits of Korean Patent Application No. 10-2020-0017140 under 35 U.S.C. § 119, filed in the Korean Intellectual Property Office on Feb. 12, 2020, the entire contents of which are incorporated herein by reference.

BACKGROUND

1. Technical Field

One or more embodiments relate to a display device.

2. Description of the Related Art

Display devices have been used for various purposes. Also, because the thickness and weight of the display devices have been reduced, the utilization range of the display devices has increased.

As display devices are utilized variously, demand has been increasing for longer display device lifespan and high-quality display device images.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments may provide a display device, the lifespan and quality of which may be improved. However, the above technical features are exemplary, and the scope of the disclosure is not limited thereto.

Additional aspects will be set forth in part in the description which follows and, in part, will be apparent from the description, or may be learned by practice of the presented embodiments of the disclosure.

According to one or more embodiments, a display device may include a substrate, and an array of pixels on the substrate, wherein the array of the pixels may include a first column in which first pixels emitting first color light and second pixels emitting second color light are alternately disclosed in a first direction, and a second column adjacent to the first column, the second column including third pixels that emit third color light and are disposed in the first direction. The second column may include groups each including two or more third pixels, and a first distance between adjacent third pixels included in a same group may be less than a second distance between adjacent third pixels included in different groups.

The two or more third pixels may include an even number of third pixels.

The two or more third pixels may include at least four third pixels.

Each of the groups in the second column may include a first third pixel and a second third pixel disposed sequentially in the first direction, a second pixel of the first column may be disposed between opposite edges of the first third pixel, the opposite edges being at opposite sides of the first third pixel in the first direction, and another second pixel of the first column may be disposed between opposite edges of the second third pixel, the opposite edges being at opposite sides of the second third pixel in the first direction.

Each of the groups in the second column may include a third pixel and another third pixel disposed sequentially and adjacent to each other, a first pixel of the first column may be disposed between opposite edges of the third pixel, the opposite edges being at opposite sides of the third pixel in the first direction, and another first pixel of the first column may be disposed between opposite edges of the another third pixel, the opposite edges being at opposite sides of the another third pixel in the first direction.

A third distance between a first pixel and a second pixel adjacent to each other in the first column may be greater than the first distance and less than the second distance.

The array of the pixels may include a third column adjacent to the second column, the third column comprising the first and second pixels that may be alternately disposed in the first direction, and a fourth column adjacent to the third column, the fourth column including the third pixels that emit third color light and are disposed in the first direction.

A first pixel in the first column and a first pixel in the third column may be disposed in a first row direction that is in a second direction perpendicular to the first direction, a second pixel in the first column and a second pixel in the third column may be disposed in a second row direction that may be in the second direction, the fourth column may include groups each including two or more third pixels, and the groups in the fourth column and the groups in the second column may be offset with respect to each other.

The fourth column may further include a group disposed at an edge of the fourth column and including half as many third pixels as another group of the fourth column.

The display device may further include a first light-emitting diode, a second light-emitting diode, and a third light-emitting diode respectively corresponding to a first pixel, a second pixel, and a third pixel of the array of pixels, wherein each of the first light-emitting diode, the second light-emitting diode, and the third light-emitting diode may include a pixel electrode, an emission layer, and an opposite electrode.

The emission layer of the third light-emitting diode may extend in the first direction and overlap predetermined ones of the third pixels.

The display device may further include pixel circuits electrically connected to the first light-emitting diode, the second light-emitting diode, and the third light-emitting diode, a first connection part between the pixel electrode of the first light-emitting diode and a corresponding pixel circuit, and a second connection part between the pixel electrode of the second light-emitting diode and a corresponding pixel circuit, wherein the first connection part and the second connection part may be disposed between the first pixel and the second pixel.

The display device may further include a third connection part between the pixel electrode of the third light-emitting diode and a corresponding pixel circuit. The third connection part may be adjacent to the first pixel and the second pixel.

One of the first pixel and the second pixel may include a red pixel and the other of the first pixel and the second pixel may include a green pixel, and the third pixel may include a blue pixel.

An aperture ratio of each of the third pixels may be greater than an aperture ratio of each of the first and second pixels.

According to one or more embodiments, a display device may include a substrate, pixel electrodes disposed on the substrate, a pixel defining layer disposed on the pixel electrodes, the pixel defining layer comprising openings overlapping the pixel electrodes, first emission layers, second emission layers, and third emission layers that are disposed on the pixel defining layer, and an opposite electrode disposed on the first, second, and third emission layers. The openings in the pixel defining layer may include a first column including first openings and second openings that may be alternately disposed in a first direction, and a second column adjacent to the first column, the second column including third openings disposed in the first direction, wherein the second column may include a first opening group comprising third openings, and a second opening group disposed adjacent to the first opening group in the first direction, the second opening group including third openings, and a first distance between adjacent third openings in the first opening group may be less than a second distance between the first opening group and the second opening group.

The first emission layers may respectively overlap the first openings, the second emission layers may respectively overlap the second openings, the third emission layers may be apart from one another in the first direction, and each of the third emission layers may overlap corresponding ones of the third openings.

The first emission layers may include red emission layers emitting red light, the second emission layers may include green emission layers emitting green light, and the third emission layers may include blue emission layers emitting blue light.

The pixel defining layer may include a first portion between two third openings that are adjacent to each other and overlap one of the third emission layers, and a second portion between two third openings that are adjacent to each other, one of the two third openings overlapping one of the third emission layers and the other third opening overlapping another one of the third emission layers, and a width of the first portion may be less than a width of the second portion.

The pixel defining layer may include a third portion between the first opening and the second opening that may be adjacent to each other and respectively overlap the first and second emission layers, and a width of the third portion may be greater than the width of the first portion and less than the width of the second portion.

Each of the third openings may include opposite edges at opposite sides in the first direction, a second opening of the first column may overlap the second emission layer and may be disposed between opposite edges of a first third opening included in the first opening group or the second opening group, and another second opening of the first column may overlap the second emission layer and may be disposed between opposite edges of a second third opening included in the first opening group or the second opening group.

A first opening of the first column may overlap the first emission layer and may be disposed between opposite edges of a third opening included in the first opening group or the second opening group, and another first opening of the first column may overlap the first emission layer and may be disposed between opposite edges of another third opening included in the first opening group or the second opening group.

The openings in the pixel defining layer may include a third column adjacent to the second column, the third column including first openings and second openings that are alternately disposed in the first direction, and a fourth column adjacent to the third column, the fourth column including third openings disposed in the first direction, the fourth column may include opening groups each including two or more third openings, and one of the opening groups in the fourth column and the first opening group in the second column may be offset with respect to each other.

The display device may further include pixel circuits electrically connected to the pixel electrodes, wherein connection parts between the pixel electrodes may overlap the third openings of the second column and corresponding pixel circuits may be adjacent to the first column.

A first length between an edge of one of the third openings of the second column and a corresponding connection part may be different from a second length between an edge of a neighboring third opening and a corresponding connection part.

Each of the third openings of the second column may include a concave portion adjacent to the first column.

An area of each of the third openings may be greater than an area of each of the first openings or an area of each of the second openings.

Other aspects, features and advantages of the disclosure will become better understood through the accompanying drawings, the claims and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
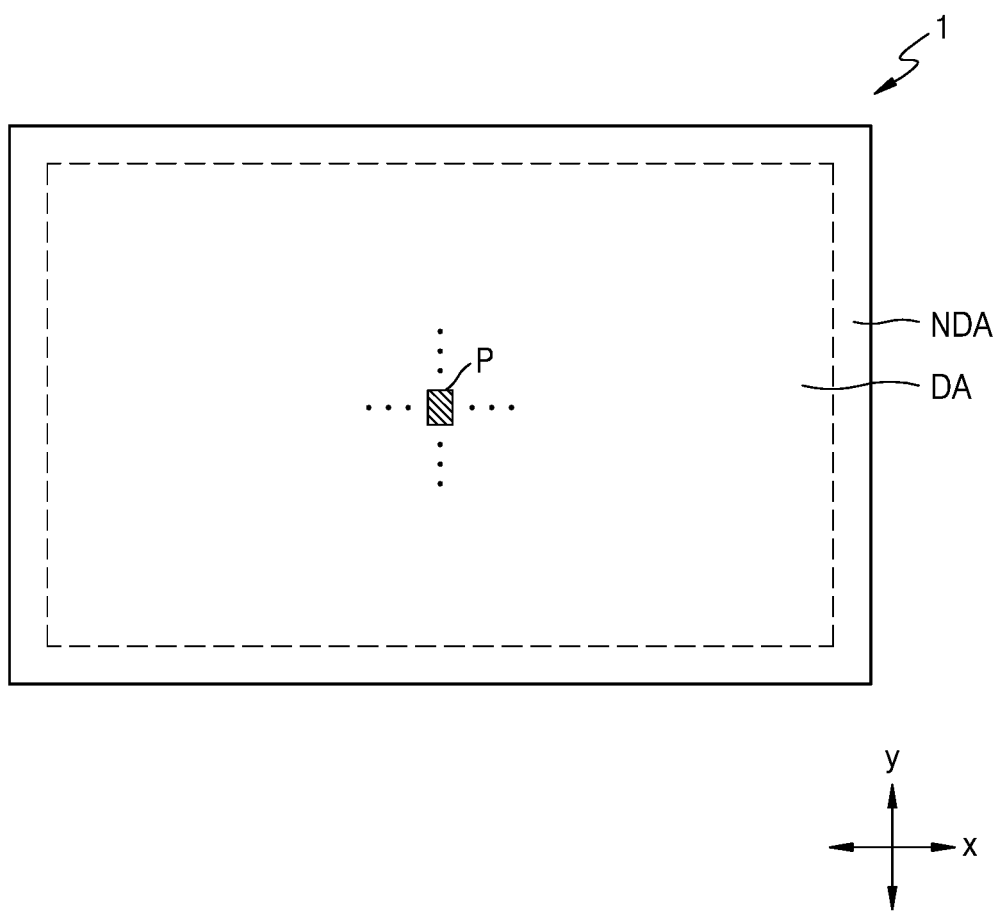
FIG. 1 is a schematic plan view of a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or." Throughout the disclosure, the expression "at least one of a, b or c" indicates only a, only b, only c, both a and b, both a and c, both b and c, all of a, b, and c, or variations thereof.

While such terms as "first," "second," etc., may be used to describe various components, such components are not to be limited to the above terms. The above terms are used only to distinguish one component from another.

An expression used in the singular encompasses the expression of the plural, unless it has a clearly different meaning in the context.

Terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. For example, intervening layers, regions, or components may be present.

Sizes of components in the drawings may be exaggerated for convenience of explanation. In other words, since sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

The term overlap may include layer, stack, face or facing, extending over, extending under, extending under, covering or partly covering or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic plan view of a display device 1 according to an embodiment.

Referring to FIG. 1, the display device 1 may include a display area DA and a non-display area NDA adjacent to the display area DA (e.g., on an outer portion of the display area DA). The display device 1 may provide images via arrays of pixels that may be two-dimensionally arranged in the display area DA.

Each of the pixels in the display device 1 may be a region emitting light of a certain color, and the display device 1 may provide images by using light emitted from the pixels. For example, each of the pixels may emit red light, green light, or blue light.

Each of the pixels may emit light of a certain color by using a light-emitting diode, e.g., an organic light-emitting diode. Each of the organic light-emitting diodes may emit, for example, red light, green light, or blue light. Each of the organic light-emitting diodes may be connected to a pixel circuit including a transistor and a capacitor.

The non-display area NDA may not provide images, and may surround (e.g., entirely surround) the display area DA. A driver or a main power line for providing pixel circuits with electrical signals or electric power may be in the non-display area NDA. The non-display area NDA may include a pad to which an electronic device or a printed circuit board may be electrically connected.

The display area DA may have a polygonal shape including a rectangular shape, as shown in FIG. 1. For example, the display area DA may have a rectangular shape in which a horizontal length may be greater than a vertical length, a rectangular shape in which a horizontal length may be less than a vertical length, or a square shape. As another example, the display area DA may have various shapes, e.g., an elliptical shape or a circular shape.

The display device 1 may include a mobile phone, a television, a billboard, a tablet PC, a laptop, a smart watch or a smart band worn on a wrist, etc.

Figure 2:
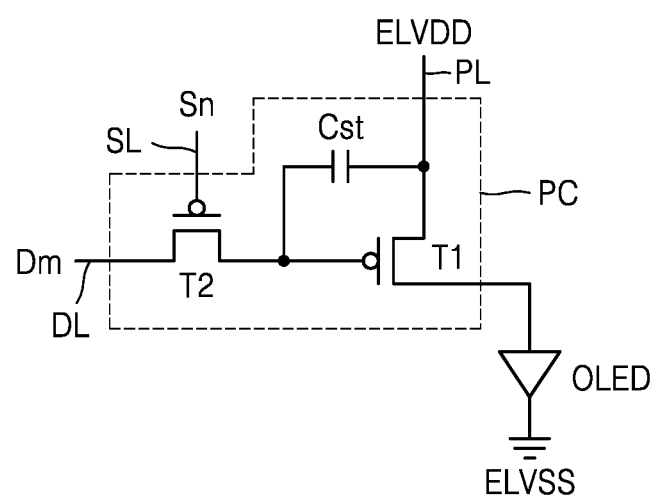
FIG. 2 is a schematic diagram of an equivalent circuit connected to an organic light-emitting diode in a display device according to an embodiment.

FIG. 2 is a schematic diagram of an equivalent circuit connected to an organic light-emitting diode OLED in a display device according to an embodiment.

Referring to FIG. 2, the organic light-emitting diode OLED may be electrically connected to a pixel circuit PC. The pixel circuit PC may include a first thin film transistor T1, a second thin film transistor T2, and a storage capacitor Cst.

The second thin film transistor T2 may be a switching thin film transistor and may be connected to a scan line SL and a data line DL, and may be configured to transfer a data voltage (or data signal Dm) input from the data line DL to the first thin film transistor T1 based on a switching voltage (or switching signal Sn) input from the scan line SL. The storage capacitor Cst may be connected to the second thin film transistor T2 and a driving voltage line PL and may store a voltage corresponding to a difference between a voltage transferred from the second thin film transistor T2 and a first power voltage ELVDD supplied to the driving voltage line PL.

The first thin film transistor T1 may be a driving thin film transistor connected to the driving voltage line PL and the storage capacitor Cst and may control a driving current flowing in the organic light-emitting diode OLED from the driving voltage line PL, corresponding to the voltage value stored in the storage capacitor Cst. The organic light-emitting diode OLED may emit light having a certain luminance according to the driving current. An opposite electrode (e.g., a cathode) of the organic light-emitting diode OLED may receive supply of a second power voltage ELVSS.

FIG. 2 illustrates that the pixel circuit PC may include two thin film transistors and one storage capacitor, but one or more embodiments are not limited thereto. The number of thin film transistors and the number of storage capacitors may vary depending on a design of the pixel circuit PC. For example, the pixel circuit PC may include three, four, five, or more thin film transistors. In some embodiments, at least one thin film transistor may be further provided between the first thin film transistor T1 and the organic light-emitting diode OLED, and the first thin film transistor T1 and the organic light-emitting diode OLED may be electrically connected to each other via at least one thin film transistor.

Figure 3:
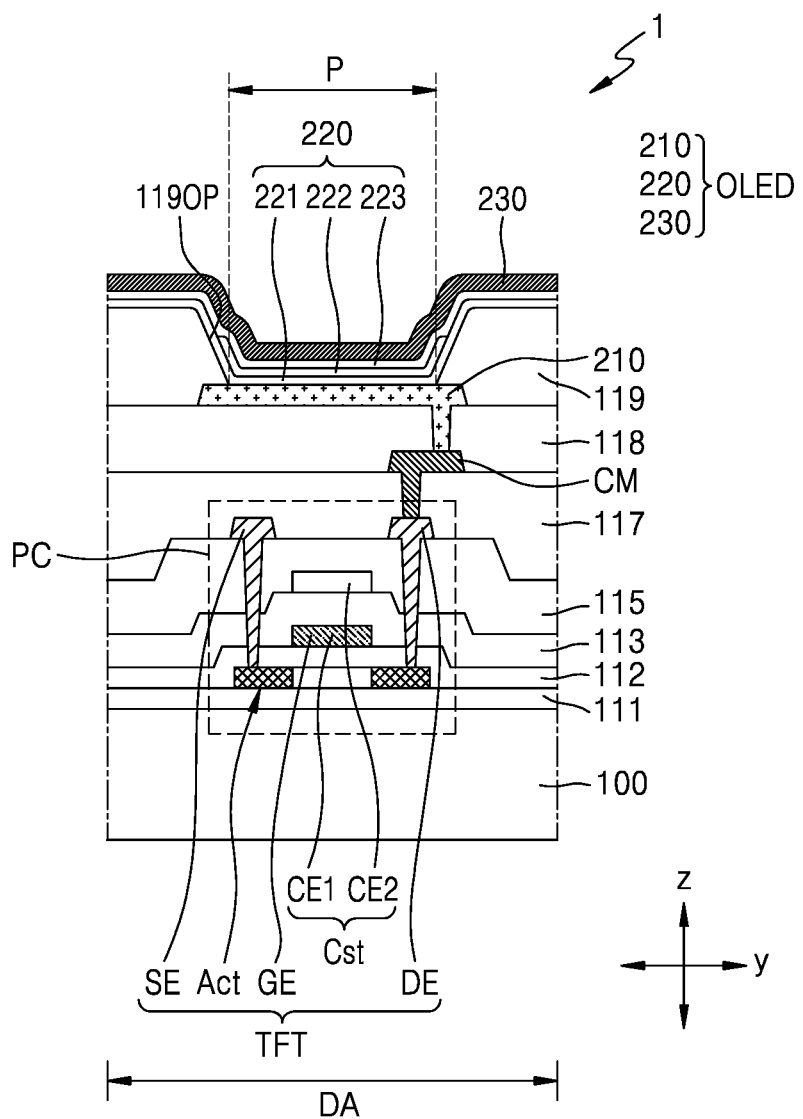
FIG. 3 is a schematic cross-sectional view of a display device according to an embodiment.

FIG. 3 is a schematic cross-sectional view of the display device 1 according to an embodiment. FIG. 3 shows a cross-section of the display area DA.

Referring to FIG. 3, the display device 1 may include a substrate 100, a pixel circuit PC on the substrate 100, and an organic light-emitting diode OLED on the pixel circuit PC, the organic light-emitting diode OLED being electrically connected to the pixel circuit PC.

The substrate 100 may include glass or a polymer resin. The polymer resin may include polyethersulfone, polyacrylate, polyether imide, polyethylene naphthalate, polyethylene terephthalate, polyphenylene sulfide, polyarylate, polyimide, polycarbonate, cellulose acetate propionate, etc., or a combination thereof. The substrate 100 including the polymer resin may be flexible, rollable, or bendable. The substrate 100 may have a multi-layered structure including a layer including the polymer resin stated above and an inorganic layer (not shown).

The buffer layer 111 may reduce or prevent infiltration of impurities, moisture, or external air from below the substrate 100, and may provide a planarized surface on the substrate 100. The buffer layer 111 may include an inorganic insulating material such as silicon oxide, silicon oxynitride, and silicon nitride, and may have a single-layered or multi-layered structure including the stated materials.

The pixel circuit PC may be on the buffer layer 111 and may include a thin film transistor TFT and a storage capacitor Cst.

The thin film transistor TFT may include a semiconductor layer Act, a gate electrode GE overlapping a channel region of the semiconductor layer Act, and a source electrode SE and a drain electrode DE respectively connected to a source region and a drain region of the semiconductor layer Act. A gate insulating layer 112 may be between the semiconductor layer Act and the gate electrode GE, and a first interlayer insulating layer 113 and a second interlayer insulating layer 115 may be between the gate electrode GE and the source electrode SE or between the gate electrode GE and the drain electrode DE.

The storage capacitor Cst may overlap the thin film transistor TFT. The storage capacitor Cst may include a first capacitor plate CE1 and a second capacitor plate CE2 overlapping each other. In some embodiments, the gate electrode GE of the thin film transistor TFT may include the first capacitor plate CE1 of the storage capacitor Cst. The first interlayer insulating layer 113 may be between the first capacitor plate CE1 and the second capacitor plate CE2.

The semiconductor layer Act may include polysilicon. In some embodiments, the semiconductor layer Act may include amorphous silicon. In some embodiments, the semiconductor layer Act may include an oxide of at least one selected from the group of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer Act may include a channel region, and a source region and a drain region doped with impurities.

The gate insulating layer 112 may include an inorganic insulating material such as silicon oxide, silicon oxynitride, and silicon nitride, and may have a single-layered or multi-layered structure including the stated materials.

The gate electrode GE or the first capacitor plate CE1 may have a single-layered or multi-layered structure including a metal material such as molybdenum (Mo), aluminum (Al), copper (Cu), and/or titanium (Ti).

The first interlayer insulating layer 113 may include an inorganic insulating material such as silicon oxide, silicon oxynitride, and silicon nitride, and may have a single-layered or multi-layered structure including the stated materials.

The second capacitor plate CE2 may have a single-layered or multi-layered structure including aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), and/or copper (Cu).

The second interlayer insulating layer 115 may include an inorganic insulating material such as silicon oxide, silicon oxynitride, and silicon nitride, and may have a single-layered or multi-layered structure including the stated materials.

The source electrode SE and/or the drain electrode DE may have a single-layered or multi-layered structure including aluminum (Al), platinum (Pt), palladium (Pd), argentum (Ag), magnesium (Mg), aurum (Au), nickel (Ni), neodymium (Nd), iridium (Ir), chromium (Cr), nickel (Ni), lithium (Li), calcium (Ca), molybdenum (Mo), titanium (Ti), tungsten (W), and/or copper (Cu). For example, the source electrode SE or the drain electrode DE may have a triple-layered structure including titanium layer/aluminum layer/titanium layer.

The pixel circuit PC including the thin film transistor TFT and the storage capacitor Cst may be electrically connected to a pixel electrode 210. In an embodiment, as shown in FIG. 3, the pixel circuit PC and the pixel electrode 210 may be electrically connected to each other via a contact metal CM. In another embodiment, an additional contact metal may be further provided between the pixel circuit PC and the pixel electrode 210. The pixel circuit PC and the pixel electrode 210 may be electrically connected to each other via the contact metal CM and the additional contact metal between the contact metal CM and the pixel electrode 210. As another example, the pixel circuit PC and the pixel electrode 210 may be electrically connected to each other directly without the contact metal CM intervening.

The contact metal CM may be on a first upper insulating layer 117 and may be connected to the pixel circuit PC via a contact hole in the first upper insulating layer 117. The contact metal CM may have a single-layered or multi-layered structure including aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), and/or copper (Cu). In some embodiments, the contact metal CM may have a triple-layered structure including a titanium layer/an aluminum layer/a titanium layer.

The first upper insulating layer 117 may include an inorganic insulating material and/or an organic insulating material. The inorganic insulating material in the first upper insulating layer 117 may include silicon oxide, silicon oxynitride, silicon nitride, etc. The organic insulating material in the first upper insulating layer 117 may include acryl, benzocyclobutene (BCB), polyimide, hexamethyldisiloxane (HMDSO), etc., or a combination thereof.

A second upper insulating layer 118 may be on the contact metal CM. The second upper insulating layer 118 may include an inorganic insulating material and/or an organic insulating material. The inorganic insulating material in the second upper insulating layer 118 may include silicon oxide, silicon oxynitride, silicon nitride, etc., or a combination thereof. In some embodiments, the second upper insulating layer 118 may include an organic insulating material such as acryl, benzocyclobutene (BCB), polyimide, hexamethyldisiloxane (HMDSO), etc., or a combination thereof.

The pixel electrode 210 may be on the second upper insulating layer 118. The pixel electrode 210 may be connected to the contact metal CM via a contact hole in the second upper insulating layer 118.

The pixel electrode 210 may include a reflective layer including argentum (Ag), magnesium (Mg), aluminum (Al), platinum (Pt), palladium (Pd), aurum (Au), nickel (Ni), neodymium (Nd), iridium (Ir), chromium (Cr), or a compound thereof. The pixel electrode 210 may include a reflective layer including the above-stated material, and a transparent conductive layer on and/or under the reflective layer. The transparent conductive layer may include indium tin oxide (ITO), indium zinc oxide (IZO), zinc oxide (ZnO), indium oxide ($In_2O_3$), indium gallium oxide, aluminum zinc oxide (AZO), or a combination thereof. In an embodiment, the pixel electrode 210 may have a triple-layered structure including ITO layer/Ag layer/ITO layer that may be stacked sequentially on each other.

A pixel defining layer 119 may be on the pixel electrode 210. The pixel defining layer 119 may cover edges of the pixel electrode 210 and may include an opening 119OP overlapping a central portion of the pixel electrode 210.

The pixel defining layer 119 may include an organic insulating material such as polyimide, polyamide, an acrylic resin, benzocyclobutene, hexamethyldisiloxane (HMDSO), a phenol resin, etc., or a combination thereof.

An intermediate layer 220 may include an emission layer 222 overlapping the pixel electrode 210. The emission layer 222 may include an organic material. The emission layer 222 may include a polymer or low-molecular weight organic material emitting certain color light.

The intermediate layer 220 may further include at least one functional layer. For example, the intermediate layer 220 may further include a first functional layer 221 and a second functional layer 223 under and on the emission layer 222.

The first functional layer 221 may have a single-layered or multi-layered structure. For example, in case that the first functional layer 221 includes a polymer material, the first functional layer 221 may include a hole transport layer (HTL) having a single-layered structure, and may include poly-(3,4)-ethylene-dihydroxy thiophene (PEDOT), polyaniline (PANI), or a combination thereof. In case that the first functional layer 221 includes a low-molecular weight organic material, the first functional layer 221 may include a hole injection layer (HIL) and an HTL.

The second functional layer 223 may have a single-layered or multi-layered structure. In case that the first functional layer 221 and the emission layer 222 include a polymer material, the second functional layer 223 may be provided. The second functional layer 223 may include an electron transport layer (ETL) and/or an electron injection layer (EIL).

Each of the first functional layer 221 and the second functional layer 223 may be integrally provided to cover (e.g., entirely cover) the display area DA.

An opposite electrode 230 may include a conductive material having a relatively low work function. For example, the opposite electrode 230 may include a (semi-)transparent layer including argentum (Ag), magnesium (Mg), aluminum (Al), nickel (Ni), chromium (Cr), lithium (Li), calcium (Ca), or an alloy thereof. As another example, the opposite electrode 230 may further include a layer including ITO, IZO, ZnO, or $In_2O_3$ on the (semi-)transparent layer including the above material. In an embodiment, the opposite electrode 230 may include argentum (Ag) and magnesium (Mg).

A stack structure of the pixel electrode 210, the intermediate layer 220, and the opposite electrode 230 may configure a light-emitting diode, e.g., organic light-emitting diode OLED. The organic light-emitting diode OLED may emit red light, green light, or blue light, and an emission area in each organic light-emitting diode OLED may correspond to a pixel. According to one or more embodiments, because an opening 119OP in the pixel defining layer 119 defines the emission area in the organic light-emitting diode OLED, a size and/or a width of a pixel P may be dependent upon a size and/or a width of the opening 119OP in the pixel defining layer 119.

The organic light-emitting diode OLED may be covered by an encapsulation member. The encapsulation member may include a thin film encapsulation layer including an inorganic encapsulation layer including an inorganic insulating material and/or an organic encapsulation layer including an organic insulating material, or an encapsulation substrate such as glass.

Figure 4:
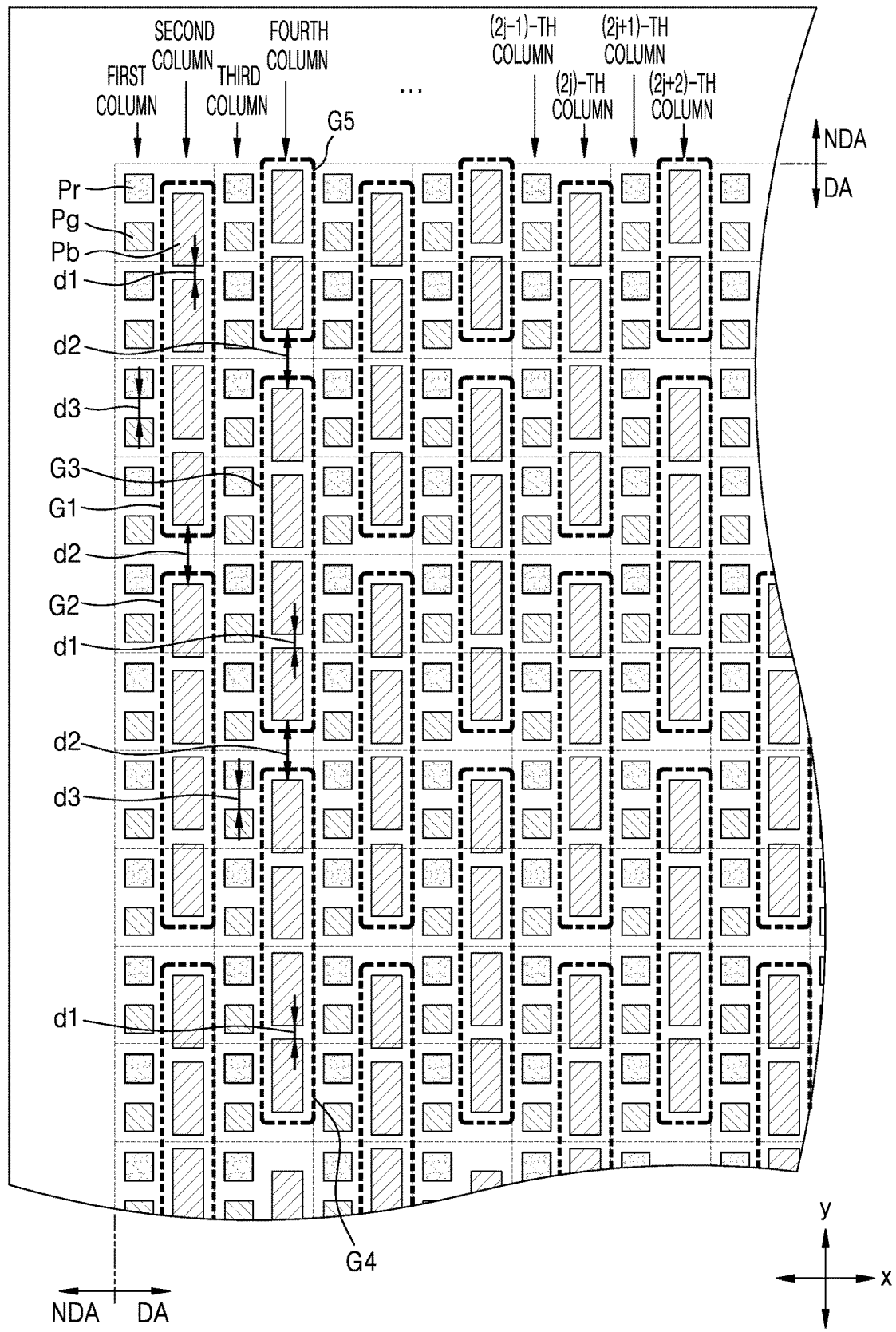
FIG. 4 is a schematic plan view showing the arrangement of pixels in a part of a display device according to an embodiment.

FIG. 4 is a schematic plan view showing the arrangement of pixels in a part of a display device according to an embodiment.

Referring to FIG. 4, arrays of pixels that may be two-dimensionally arranged in a first direction (e.g., y-direction) and a second direction (e.g., x-direction) may define the display area DA. The pixels in the array may include a first pixel of a first color, a second pixel of a second color, and a third pixel of a third color. In an embodiment, the first pixel may include a red pixel Pr emitting red light, the second pixel may include a green pixel Pg emitting green light, and the third pixel may include a blue pixel Pb emitting blue light.

The array of the pixels may include columns (or pixel columns) arranged in the first direction (e.g., y-direction). Among the first to third pixels of different colors, the first pixel and the second pixel may be arranged in a same column and the third pixel may be arranged in a different column from the others. For example, the red pixel Pr and the green pixel Pg may be in the same column, and the blue pixel Pb may be in a different column.

The array of the pixels may include a (2j−1)-th column including the red pixels Pr and the green pixels Pg, a (2j)-th column including the blue pixels Pb, a (2j+1)-th column including the red pixels Pr and the green pixels Pg, and a (2j+2)-th column including the blue pixels Pb (here, j may be 1 or greater odd-number). The array of the pixels may have a structure, in which the (2j−1)-th column, the (2j)-th column, the (2j+1)-th column, and the (2j+2)-th column may be repeatedly arranged. The (2j−1)-th column and the (2j+1)-th column may each include the red pixels Pr and the green pixels Pg that may be alternately arranged in the first direction. The (2j)-th column and the (2j+2)-th column may each include the blue pixels Pb arranged in the first direction.

In the (2j−1)-th column, e.g., a first column, the red pixel Pr and the green pixel Pg adjacent to each other may be arranged to be apart from each other in the first direction (e.g., y-direction). The red pixel Pr and the green pixel Pg may be apart a certain distance from each other.

In the (2j)-th column, e.g., a second column, the blue pixels Pb may be apart from one another. A distance between the blue pixels Pb in the second column may vary depending on the location, and the blue pixels Pb may be grouped according to the distances between the blue pixels Pb. In the second column, n blue pixels Pb (n may be 4 or greater even-number) may be adjacent to one another and may be grouped. For example, the second column may have a structure, in which groups each including n blue pixels Pb (n may be 4 or greater even-number) may be arranged in the first direction. In this regard, in FIG. 4, a first group (or a first pixel group) G1 including four blue pixels Pb and a second group (or a second pixel group) G2 including four blue pixels Pb in the second column are shown.

A first distance d1 among the blue pixels Pb in each group may be less than a second distance d2 between the groups. For example, the first distance d1 among the blue pixels Pb included in the first group G1 may be less than the second distance d2 between the first group G1 and the second group G2. Similarly, the first distance d1 among the blue pixels Pb included in the second group G2 may be less than the second distance d2 between the first group G1 and the second group G2.

The second distance d2 between the first group G1 and the second group G2 may correspond to a distance between the blue pixel Pb of the first group G1, which may be closest to the second group G2, and the blue pixel Pb of the second group G2, which may be closest to the first group G1.

The second distance d2 may be greater than a third distance d3 between the red pixel Pr and the green pixel Pg adjacent to each other, and the third distance d3 may be greater than the first distance d1.

In the (2j+1)-th column, e.g., a third column, the red pixels Pr and the green pixels Pg may be alternately arranged in the first direction (e.g., y-direction). The third column may have a structure that may be the same or substantially the same as that of the first column. In the third column, the red pixel Pr and the green pixel Pg adjacent to each other may have a third distance d3 therebetween.

Referring to the (2j−1)-th column and the (2j+1)-th column, the red pixels Pr may be arranged in a second direction crossing the first direction, e.g., one virtual column direction in the x-direction that may be perpendicular to the y-direction. Similarly, the green pixels Pg may be arranged in one another virtual column direction in the x-direction.

In the (2j+2)-th column, e.g., a fourth column, the blue pixels Pb may be apart from one another. A distance between the blue pixels Pb in the fourth column may vary depending on the location, and the blue pixels Pb may be grouped according to the distances between the blue pixels Pb.

As in the second column, the fourth column may have a structure, in which groups each including n blue pixels Pb (n may be 4 or greater even-number) may be arranged in the first direction. In this regard, in FIG. 4, a third group (or a third pixel group) G3 including four blue pixels Pb and a fourth group (or a fourth pixel group) G4 including four blue pixels Pb in the second column are shown. The first distance d1 among the blue pixels Pb in each group may be less than the second distance d2 between the groups.

Groups of the blue pixels Pb in the fourth column and groups of the blue pixels Pb in the second column may be offset with respect to each other. For example, referring to FIG. 4, the blue pixels Pb in the fourth column may be shifted by about (n/2) pixel in the first direction as compared with the blue pixels Pb in the second column. For example, some of the blue pixels Pb of the third group G3 in the fourth column correspond to the blue pixels Pb of the first group G1 in the second column, and the other blue pixels Pb of the third group G3 may correspond to the blue pixels Pb of the second group G2 in the second column.

Referring to the (2j)-th column and the (2j+2)-th column, n blue pixels Pb may be grouped, and groups may be arranged with the second distance d2 therebetween in the first direction (e.g., y-direction) and in zig-zags in the second direction (e.g., x-direction).

The (2j+2)-th column, e.g., the fourth column, may include a fifth group G5 adjacent to the non-display area NDA. Unlike in the second column, because the blue pixels Pb in the fourth column may be shifted by about (n/2) pixels in the first direction, the fifth group G5 at an edge of the fourth column may include (n/2) blue pixels Pb.

Referring to FIG. 4, each blue pixel Pb may be adjacent to the red pixel Pr and the green pixel Pg. For example, one blue pixel Pb in the (2j)-th column may be adjacent to one red pixel Pr and one green pixel Pg in the (2j−1)-th column, and one blue pixel Pb in the (2j+2)-th column may be adjacent to one red pixel Pr and one green pixel Pg in the (2j+1)-th column. Because the distance between the blue pixels Pb in the (2j)-th column and/or the (2j+2)-th column varies depending on the location of the blue pixel Pb as described above, locational relationship among the red pixel Pr, the green pixel Pg, and the blue pixel Pb may vary depending on the location of the blue pixel Pb as described later with reference to FIG. 5.

Figure 5:
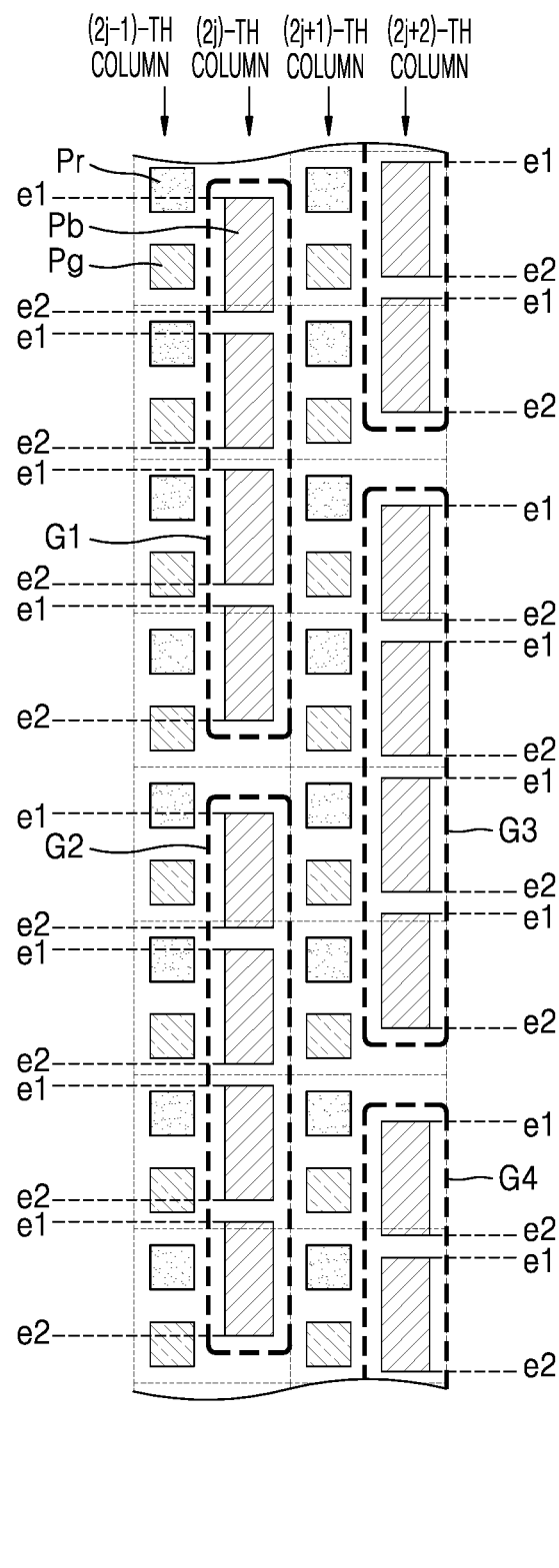
FIG. 5 is a schematic plan view partially showing the pixels of FIG. 4.

FIG. 5 is a schematic plan view partially showing the pixels of FIG. 4.

Referring to FIG. 5, the blue pixels Pb in the (2j)-th column and the (2j+2)-th column may each have a certain length in the first direction (e.g., y-direction). Each of the blue pixels Pb may have a first edge e1 and a second edge e2 that may be opposite each other in the first direction, and a distance between the first edge e1 and the second edge e2 may correspond to the length of the blue pixel Pb.

The red pixel Pr and the green pixel Pg may be adjacent to the blue pixel Pb, and one of the red pixel Pr and the green pixel Pg may be located within a range from the first edge e1 to the second edge e2 of the adjacent blue pixel Pb. For example, from among n blue pixels Pb in each group, the green pixel Pg (or red pixel) may be located within a range between the edges of each of the (n/2) pixels that may be sequentially arranged, and the red pixel Pr (or green pixel) may be located within a range between the edges in each of the other (n/2) pixels in each group.

The (2j)-th column of FIG. 5 will be described below.

The first blue pixel Pb in each of the first group G1 and the second group G2 may include the first edge e1 and the second edge e2 opposite to the first edge e1. The red pixel Pr adjacent to the first blue pixel Pb may be out of the range (e.g., completely out of the range) between the first edge e1 and the second edge e2 of the first blue pixel Pb, and the green pixel Pg adjacent to the first blue pixel Pb may be located within the range between the first edge e1 and the second edge e2 of the first blue pixel Pb.

Similarly, the second blue pixel Pb in each of the first group G1 and the second group G2 includes the first edge e1 and the second edge e2, and the green pixel Pg may be located within a range between the first edge e1 and the second edge e2 of the second blue pixel Pb.

The third blue pixel Pb in each of the first group G1 and the second group G2 includes the first edge e1 and the second edge e2, and the red pixel Pr may be located within a range between the first edge e1 and the second edge e2 of the third blue pixel Pb.

Similarly, the fourth blue pixel Pb in each of the first group G1 and the second group G2 includes the first edge e1 and the second edge e2, and the red pixel Pr may be located within a range between the first edge e1 and the second edge e2 in the fourth blue pixel Pb.

The (2j+2)-th column of FIG. 5 will be described below.

The first blue pixel Pb in each of the third group G3 and the fourth group G4 may include the first edge e1 and the second edge e2. The red pixel Pr adjacent to the first blue pixel Pb may be out of the range between the first edge e1 and the second edge e2 of the first blue pixel Pb, and the green pixel Pg adjacent to the first blue pixel Pb may be located within the range between the first edge e1 and the second edge e2 of the first blue pixel Pb. Similarly, the green pixel Pg may be located within a range between the first edge e1 and the second edge e2 of the second blue pixel Pb in each of the third group G3 and the fourth group G4.

The third blue pixel Pb in each of the third group G3 and the fourth group G4 includes the first edge e1 and the second edge e2, and the red pixel Pr may be located within a range between the first edge e1 and the second edge e2 of the third blue pixel Pb. Similarly, the red pixel Pr may be located within a range between the first edge e1 and the second edge e2 of the fourth blue pixel Pb in each of the third group G3 and the fourth group G4.

In FIG. 5, in the (2j)-th column and/or the (2j+2)-th column, the green pixel Pg may be located within the range between the opposite edges in each of the first to (n/2)-th blue pixels Pb, and the red pixel Pr may be located within the range between the opposite edges in each of the (n/2+1)-th to n-th blue pixels Pb in each group. In another embodiment, locations of the green pixel Pg and the red pixel Pr may be switched. In the (2j)-th column and/or the (2j+2)-th column, the red pixel Pr may be located within the range between the opposite edges in each of the first to (n/2)-th blue pixels Pb, and the green pixel Pg may be located within the range between the opposite edges in each of the (n/2+1)-th to n-th blue pixels Pb in each group.

Figure 6A:
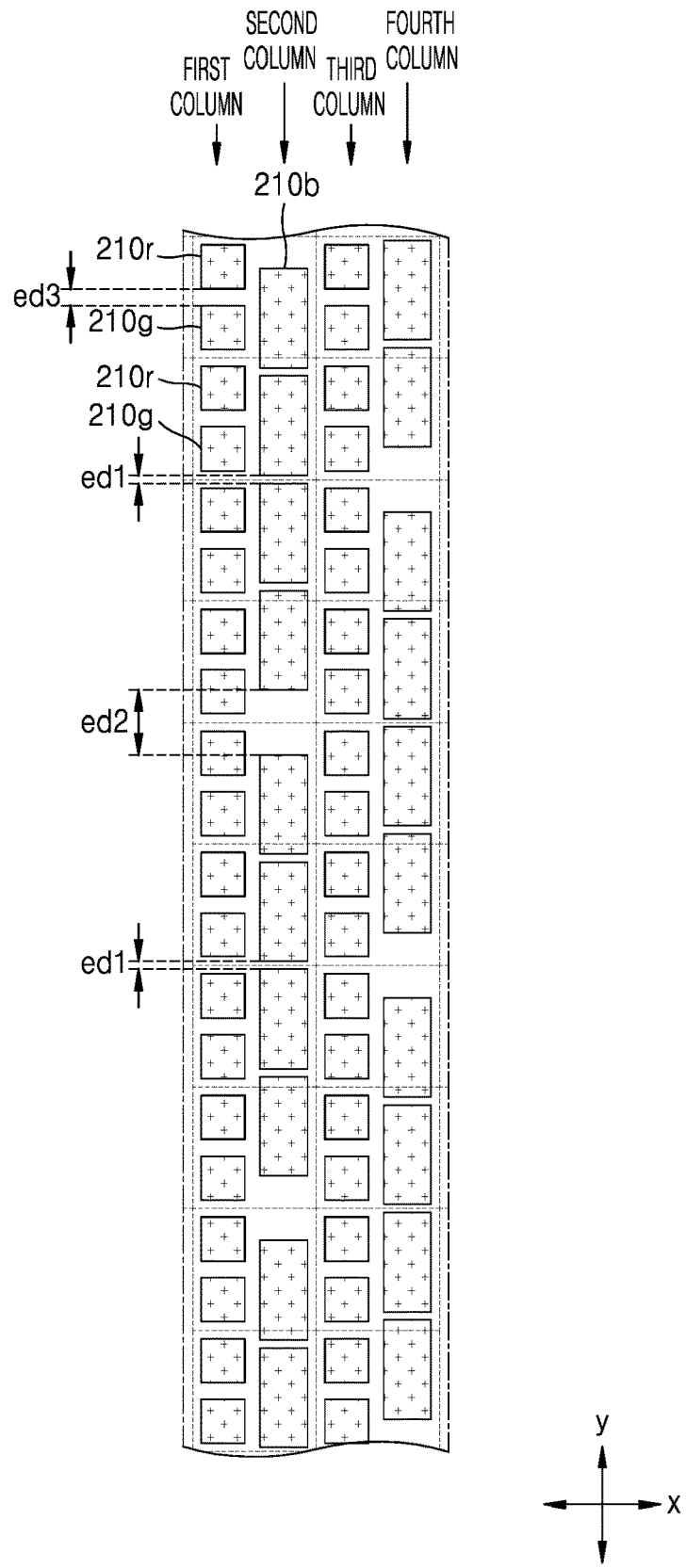
FIGS. 6A to 6C are schematic plan views partially illustrating processes of manufacturing a display device, according to an embodiment.
Figure 6B:
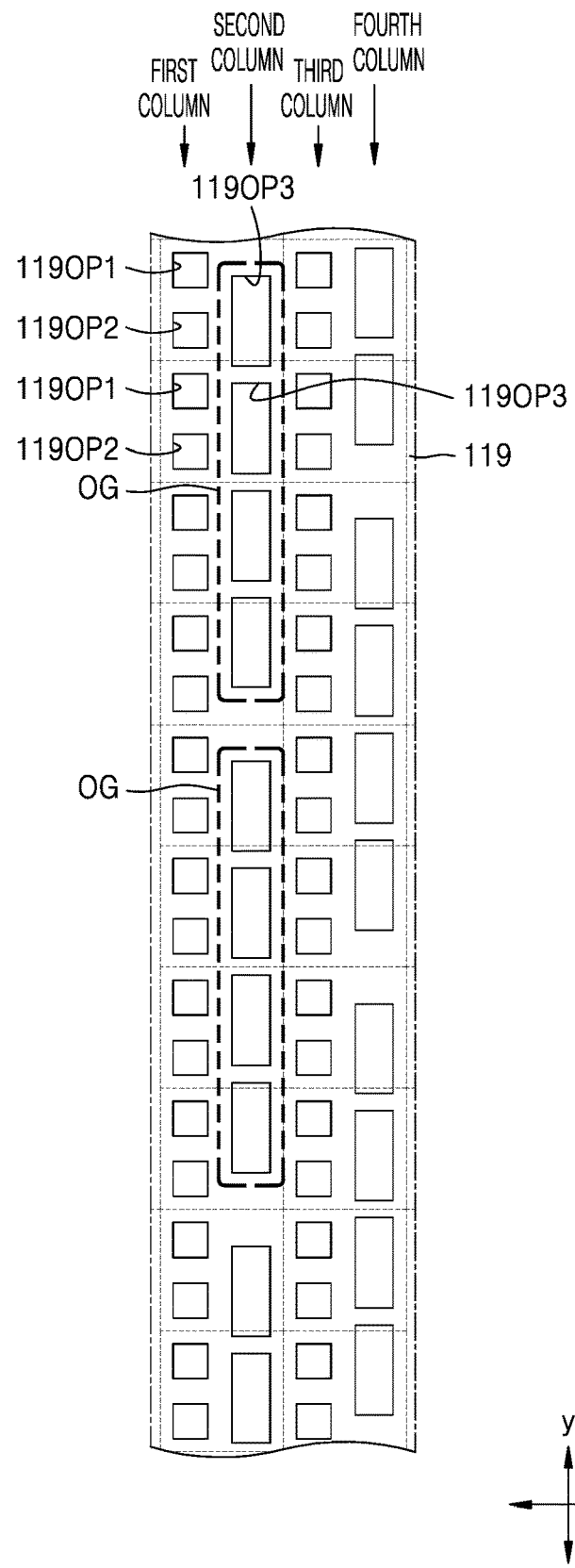
Figure 6C:
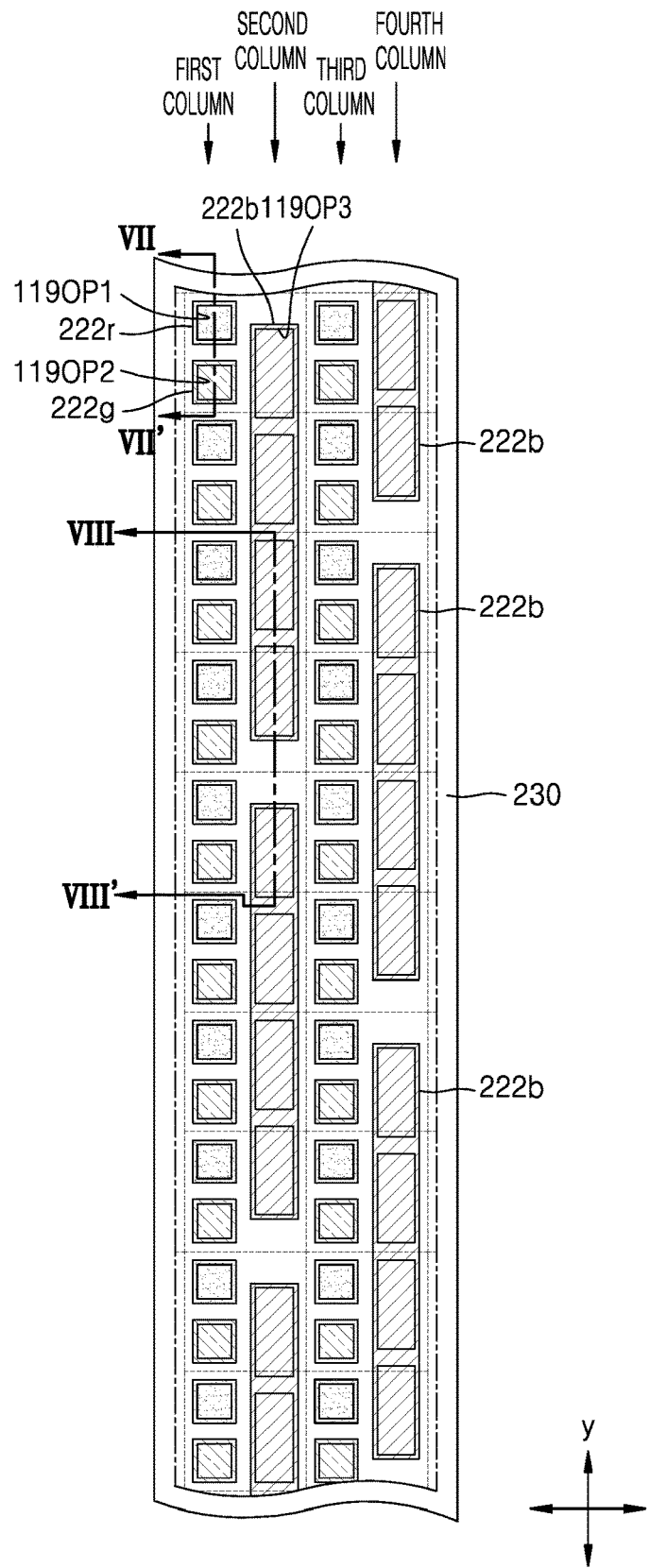

FIGS. 6A to 6C are schematic plan views partially illustrating processes of manufacturing a display device, according to an embodiment.

Referring to FIG. 6A, pixel electrodes may be arranged in each of columns. First pixel electrodes 210r corresponding to the red pixels and second pixel electrodes 210g corresponding to the green pixels may be alternately arranged in the first direction (e.g., y-direction) to form one column. Third pixel electrodes 210b corresponding to the blue pixels may be arranged in the first direction to form another column.

The column including the first pixel electrodes 210r and the second pixel electrodes 210g and the column including the third pixel electrodes 210b may be adjacent to each other in the second direction crossing the first direction. FIG. 6A shows a first column including the first pixel electrodes 210r and the second pixel electrodes 210g, a second column including the third pixel electrodes 210b, a third column including the first pixel electrodes 210r and the second pixel electrodes 210g, and a fourth column including the third pixel electrodes 210b. The first to fourth columns may be repeatedly arranged in the second direction.

In the first and third columns, the first pixel electrodes 210r and the second pixel electrodes 210g may be alternately arranged in the first direction. In the third column, the first pixel electrode 210r and the second pixel electrode 210g may be alternately arranged in the first direction. The first pixel electrode 210r and the second pixel electrode 210g may be apart a certain distance (hereinafter, referred to as a third electrode distance ed3) from each other.

In the second and fourth columns, the third pixel electrodes 210b may be arranged in the first direction, and a distance between the third pixel electrodes 210b may vary depending on locations. In each of the second and fourth columns, n third pixel electrodes 210b may be adjacent to one another. In this regard, FIG. 6A shows that fourth third pixel electrodes 210b may be adjacent to one another as one pixel electrode group.

A first electrode distance ed1 between adjacent third pixel electrodes 210b in one pixel electrode group may be less than a second electrode distance ed2 between two adjacent pixel electrode groups. For example, the second electrode distance ed2 between the fourth third pixel electrode 210b and the fifth third pixel electrode 210b in the second column of FIG. 6A may be greater than the first electrode distance ed1 between the first third pixel electrode 210b and the second third pixel electrode 210b. The second electrode distance ed2 may be greater than the third electrode distance ed3, and the first electrode distance ed1 may be less than the third electrode distance ed3.

A distance between the third pixel electrodes 210b in one pixel electrode group may be constant. For example, a distance between the first third pixel electrode 210b and the second third pixel electrode 210b in the second column, a distance between the second third pixel electrode 210b and the third third pixel electrode 210b, and a distance between the third third pixel electrode 210b and the fourth third pixel electrode 210b shown in FIG. 6A may each correspond to the first electrode distance ed1.

As in the second column, n third pixel electrodes 210b may be adjacent to one another in the first direction in the fourth column. Referring to the fourth column of FIG. 6A, four third pixel electrodes 210b may be adjacent to one another with the first electrode distance ed1 therebetween, and the group of fourth third pixel electrodes 210b and another group of fourth third pixel electrodes 210b may be apart the second electrode distance ed2 from each other.

The third pixel electrodes 210b in the fourth column may be shifted by about (n/2) pixels in the first direction, as compared with the third pixel electrodes 210b in the second column. For example, as shown in FIG. 6A, the third pixel electrodes 210b in the fourth column may be shifted from the third pixel electrodes 210b in the second column by a distance corresponding to about two third pixel electrodes 210b in the first direction.

Referring to FIG. 6B, the pixel defining layer 119 may be on the first to third pixel electrodes 210r, 210g, and 210b (FIG. 6A). The pixel defining layer 119 includes first to third openings 119OP1, 119OP2, and 119OP3 respectively overlapping the first to third pixel electrodes 210r, 210g, and 210b. An area (or width) of at least one of the first to third openings 119OP1, 119OP2, and 119OP3 may be greater than those of the other openings. For example, an area (or width)

of the third opening 119OP3 may be greater than that of the first opening 119OP1 or the second opening 119OP2.

From among the first to third openings 119OP1, 119OP2, and 119OP3, the first and second openings 119OP1 and 119OP2 may be alternately arranged in the first direction in one column, and the third openings 119OP3 may be arranged in the first direction in another column.

Referring to FIG. 6B, each of the first and third columns include the first openings 119OP1 and the second openings 119OP2 that may be alternately arranged in the first direction.

Each of the second and fourth columns may include the third openings 119OP3 arranged in the first direction, and a distance between the third openings 119OP3 may vary depending on the location. For example, the third openings 119OP3 may be arranged in the first direction, and n third openings 119OP3 may be adjacent to one another. In some embodiments, as shown in FIG. 6B, four third openings 119OP3 may be adjacent to one another in one opening group OG.

The third openings 119OP3 in the fourth column may be shifted in the first direction by about (n/2) openings as compared with the third openings 119OP3 in the second column. For example, as shown in FIG. 6B, the third openings 119OP3 in the fourth column may be shifted from the third openings 119OP3 in the second column by a distance corresponding to about two third openings 119OP3 in the first direction.

Referring to FIG. 6C, first to third emission layers 222r, 222g, and 222b may be on the pixel defining layer 119.

The first emission layer 222r may be on each of the first openings 119OP1. Likewise, the second emission layer 222g may be on each of the second openings 119OP2. In some embodiments, the first and second emission layers 222r and 222g may be alternately arranged in the first direction as shown in the first and third columns of FIG. 6C. For example, one second emission layer 222g may be between two first emission layers 222r, and one first emission layer 222r may be between two second emission layers 222g.

The third emission layer 222b may correspond to n third openings 119OP3. For example, the third emission layer 222b may overlap n third openings 119OP3. In this regard, referring to the second and fourth columns in FIG. 6C, the third emission layer 222b may overlap four third openings 119OP3. The third emission layer 222b overlapping four third openings 119OP3 may be apart from another third emission layer 222b overlapping other third openings 119OP3.

The opposite electrode 230 may be on the first to third emission layers 222r, 222g, and 222b. The opposite electrode 230 may be integrally provided to entirely cover the first to third emission layers 222r, 222g, and 222b, or to entirely cover the display area.

Referring to FIGS. 6A to 6C, the first pixel electrode 210r, the first emission layer 222r, and the opposite electrode 230 sequentially stacked on the first opening 119OP1 may configure an organic light-emitting diode emitting red light.

Likewise, the second pixel electrode 210g, the second emission layer 222g, and the opposite electrode 230 sequentially stacked on the second opening 119OP2 may configure an organic light-emitting diode emitting green light. The third pixel electrode 210b, the third emission layer 222b, and the opposite electrode 230 sequentially stacked on the third opening 119OP3 may configure an organic light-emitting diode emitting blue light.

Figure 7:
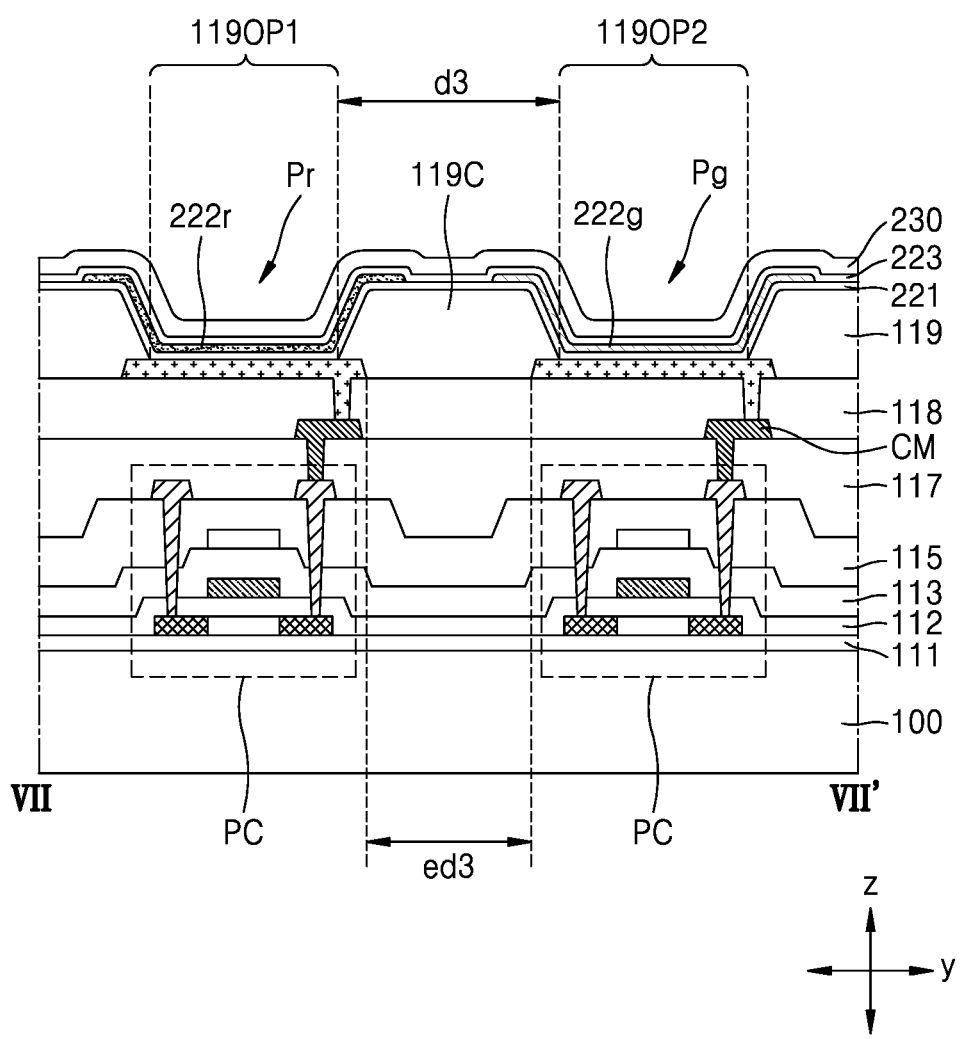
FIG. 7 is a schematic cross-sectional view of the display device taken along line VII-VII' of FIG. 6C.
Figure 8:
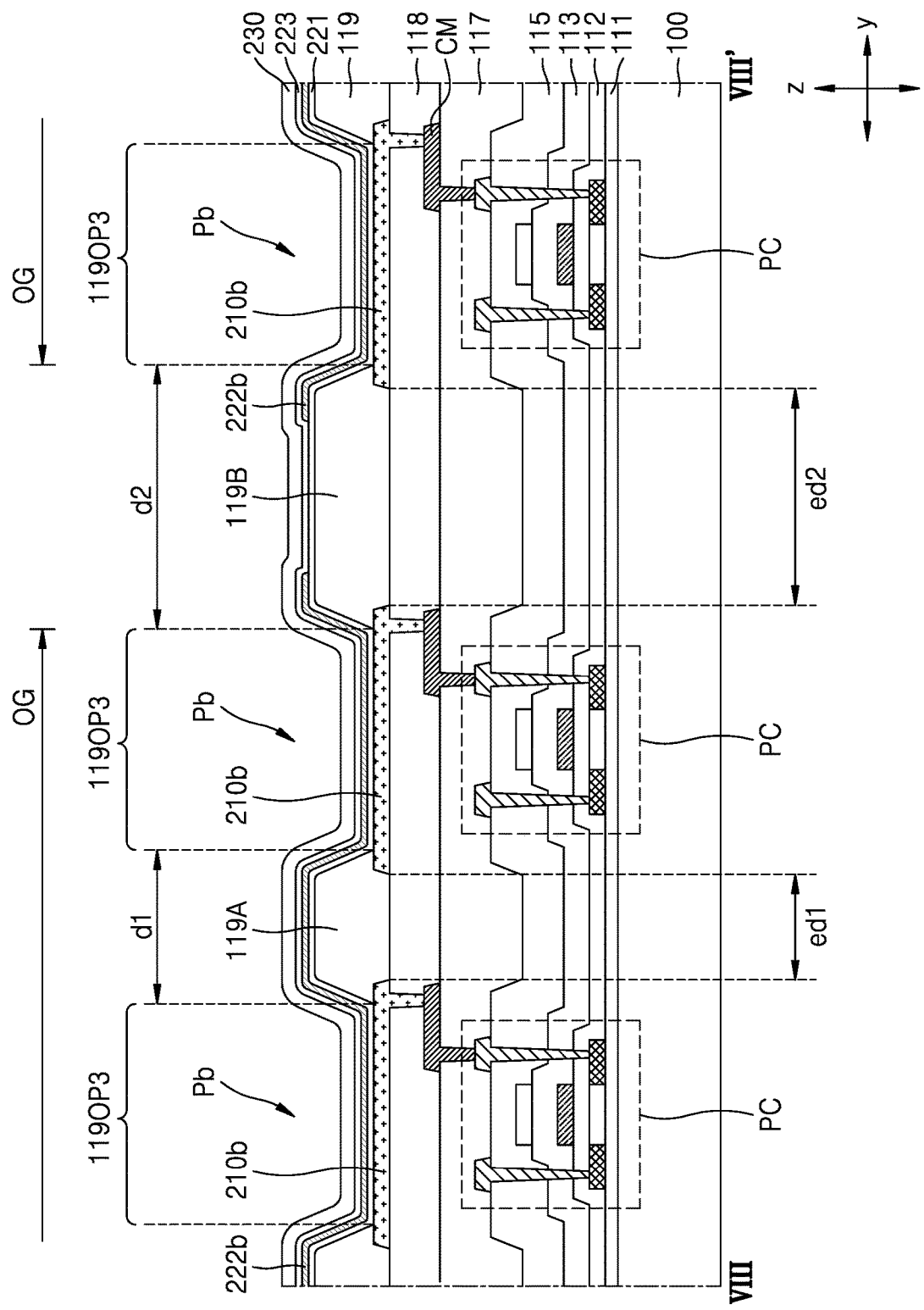
FIG. 8 is a schematic cross-sectional view of the display device taken along line VIII-VIII' of FIG. 6C.

FIG. 7 is a schematic cross-sectional view of the display device taken along line VII-VII' of FIG. 6C, and FIG. 8 is a schematic cross-sectional view of the display device taken along line VIII-VIII' of FIG. 6C.

Referring to FIGS. 7 and 8, a buffer layer 111 may be on the substrate 100, and the pixel circuit PC may be on the buffer layer 111. A detailed structure of the pixel circuit PC, insulating layers among the elements of the pixel circuit PC, and the first upper insulating layer 117, the contact metal CM, and the second upper insulating layer 118 on the pixel circuit PC may be the same as those described above with reference to FIG. 3.

The first pixel electrode 210r, the second pixel electrode 210g, and the third pixel electrode 210b may be on the second upper insulating layer 118.

The pixel defining layer 119 may include the first to third openings 119OP1, 119OP2, and 119OP3. The first to third openings 119OP1, 119OP2, and 119OP3 may respectively overlap the first pixel electrode 210r, the second pixel electrode 210g, and the third pixel electrode 210b.

The first pixel electrode 210r, the first emission layer 222r, and the opposite electrode 230 that may be sequentially stacked may emit red light through the first opening 119OP1. The first opening 119OP1 may be a region emitting red light, and the region emitting the red light may correspond to the red pixel Pr (FIG. 7).

The second pixel electrode 210g, the second emission layer 222g, and the opposite electrode 230 that may be sequentially stacked may emit green light through the second opening 119OP2. The second opening 119OP2 may be a region emitting green light, and the region emitting the green light may correspond to the green pixel Pg (FIG. 7).

The third pixel electrode 210b, the third emission layer 222b, and the opposite electrode 230 that may be sequentially stacked may emit blue light through the third opening 119OP3. The third opening 119OP3 may be a region emitting blue light, and the region emitting the blue light may correspond to the blue pixel Pb (FIG. 8).

The pixel defining layer 119 may include n third openings 119OP3 (n may be 4 or greater even-number) that may be adjacent to each other with the first distance d1 therebetween as shown in FIG. 6C and FIG. 8, and the third opening 119OP3 included in one opening group OG and the third opening 119OP3 included in another opening group OG may have the second distance d2 therebetween.

The pixel may be a region emitting light, and the region emitting the light may be defined by the opening in the pixel defining layer 119. Therefore, an area of the opening in the pixel defining layer 119 may correspond to an aperture ratio (or area) of the pixel, and the first distance d1 or the second distance d2 between the adjacent blue pixels Pb may correspond to a distance between the adjacent third openings 119OP3. Similarly, the third distance d3 between the red pixel Pr and the green pixel Pg adjacent to each other may correspond to a distance between the adjacent second openings 119OP2.

For example, the first distance d1 may correspond to a distance between adjacent third openings 119OP3 included in one opening group OG. As another example, the first distance d1 may correspond to a width (width in the first direction) of a first portion 119A of the pixel defining layer 119 between two adjacent third openings 119OP3 included in one opening group OG.

The second distance d2 may correspond to a distance between the third openings 119OP3 that may be adjacent to each other but included in different opening groups OG. As another example, the second distance d2 may correspond to a width (width in the first direction) of a second portion 119B of the pixel defining layer 119 between one third opening 119OP3 included in one opening group OG and one third opening 119OP3 included in another opening group OG. In some embodiments, the first distance d1 may be about 10 μm to about 12 μm, and the second distance d2 may be about 50 μm to about 55 μm.

The second distance d2 may be a distance between the first opening 119OP1 and the second opening 119OP2 that may be adjacent to each other, or may correspond to a width (width in the first direction) of a third portion 119C of the pixel defining layer 119 between the first opening 119OP1 and the second opening 119OP2. The third distance d3 may be about 16 μm to about 20 μm.

The first distance d1 may be greater than the first electrode distance ed1 between the third pixel electrodes 210b covered by the first portion 119A of the pixel defining layer 119. The second distance d2 may be greater than the second electrode distance ed2 between the third pixel electrodes 210b covered by the second portion 119B of the pixel defining layer 119. The third distance d3 may be greater than the third electrode distance ed3 between the first pixel electrode 210r and the second pixel electrode 210g covered by the third portion 119C of the pixel defining layer 119.

Unlike the first functional layer 221, the second functional layer 223, and the opposite electrode 230 that may entirely cover the pixel defining layer 119, the first emission layer 222r, the second emission layer 222g, and the third emission layer 222b may be individually provided.

As shown in FIG. 7, each of the first emission layers 222r overlaps each first opening 119OP1, and each of the second emission layers 222g overlaps each second opening 119OP2.

However, as described above with reference to FIG. 6C, the third emission layer 222b may overlap n third openings 119OP3 (n may be 4 or greater even-number). In this regard, FIG. 8 shows two adjacent third emission layers 222b overlapping the third openings 119OP3.

In order to improve the lifespan of the display device, it may be necessary to ensure a sufficient area of the emission areas emitting red, green, and blue light, e.g., areas of the first to third openings 119OP1, 119OP2, and 119OP3, or a sufficient area of the red pixel Pr, the green pixel Pg, and the blue pixel Pb.

In the case of the blue pixels Pb arranged in the first direction, n blue pixels Pb may be arranged adjacent to one another with the first distance d1 (see FIG. 7) therebetween, and the third emission layer 222b may be formed to correspond to the n blue pixels Pb. Thus, a sufficient area of the blue pixels Pb, e.g., the third openings 119OP3, may be ensured. In a comparative example, in case that a third emission layer corresponds to each of third openings, it may be difficult to ensure a sufficient area of the blue pixels Pb taking into account a shape of a mask for forming the third emission layer and the processing margin. In another comparative example, a third emission layer may correspond to every two third openings. As compared with the comparative example, in the display device according to one or more embodiments, the aperture ratio (or area) of the red pixel and the green pixel, as well as the blue pixel, may be increased, and thus, the aperture ratio of all the pixels may be improved by about 10% or greater.

Figure 9:
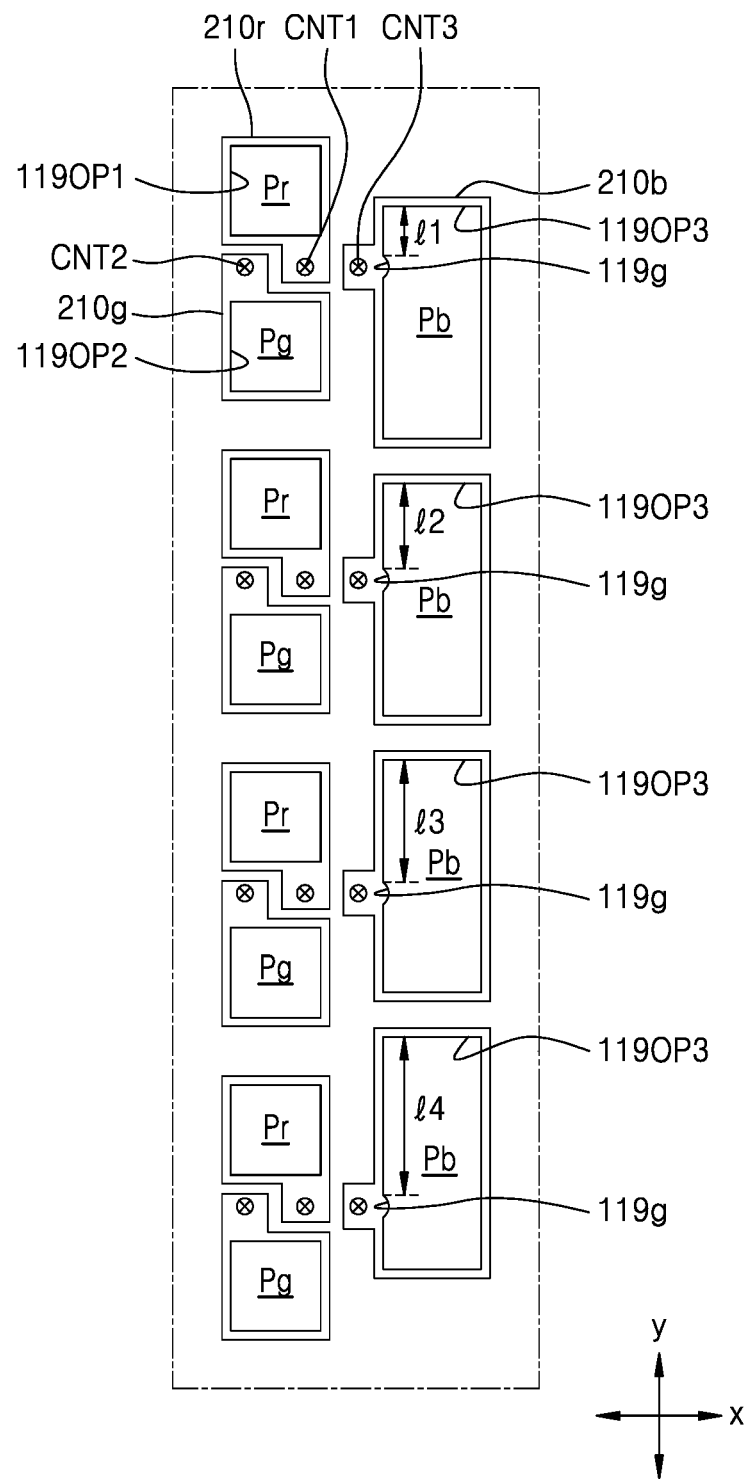
FIG. 9 is a schematic plan view partially showing a display device according to an embodiment.

FIG. 9 is a schematic plan view partially showing a display device according to an embodiment. Referring to FIG. 9, the first pixel electrode 210r and the second pixel electrode 210g may be in the first direction (e.g., y-direction). A first connection part CNT1 for electrically connecting to the first pixel electrode and the pixel circuit electrically connected to the first pixel electrode 210r may be between the first pixel electrode 210r and the second pixel electrode 210g. Similarly, a second connection part CNT2 for electrically connecting to the second pixel electrode 210g and the pixel circuit electrically connected to the second pixel electrode 210g may be between the first pixel electrode 210r and the second pixel electrode 210g.

In some embodiments, the first connection part CNT1 may be a contact part between the first pixel electrode 210r and a contact metal which electrically couples the pixel circuit to the first pixel electrode 210r. In some embodiments, the first connection part CNT1 may be a contact part between the first pixel electrode 210r and a electrode of one thin film transistor of the pixel circuit. Similarly, the second connection part CNT2 may be a contact part between the second pixel electrode 210g and a contact metal which electrically couples the pixel circuit to the second pixel electrode 210g. In some embodiments, the second connection part CNT2 may be a contact part between the second pixel electrode 210g and a electrode of one thin film transistor of the pixel circuit.

The third pixel electrodes 210b may be in the first direction (e.g., y-direction). A third connection part CNT3 for electrically connecting to the third pixel electrode 210b and the pixel circuit electrically connected to the third pixel electrode 210b may be adjacent to a side of the third pixel electrode 210b, e.g., a side of the third pixel electrode 210b adjacent to the red pixel Pr and the green pixel Pg.

The first pixel electrode 210r may include a first portion overlapping the first opening 119OP1 and a second portion protruding from the first portion towards the second pixel electrode 210g (or in the first direction), and the first connection part CNT1 may be on the second portion. The second pixel electrode 210g includes a first portion overlapping the second opening 119OP2 and a second portion protruding from the first portion towards the first pixel electrode 210r (or in the first direction), and the second connection part CNT2 may be located on the second portion. The third pixel electrode 210b may include a first portion overlapping the third opening 119OP3, and a second portion protruding from the first portion towards the first and second pixel electrodes 210r and 210g (or in the second direction). The third connection part CNT3 for electrically connecting to the third pixel electrode 210b and the pixel circuit electrically coupled to the third pixel electrode 210b may be located at the second portion of the third pixel electrode 210b. In some embodiments, the third connection part CNT3 may be a contact part between the third pixel electrode 210b and a contact metal which electrically couples the pixel circuit to the third pixel electrode 210b. In some embodiments, the third connection part CNT3 may be a contact part between the third pixel electrode 210b and a electrode of one thin film transistor of the pixel circuit.

In some embodiments, the first connection part CNT1, the second connection part CNT2, and the third connection part CNT3 adjacent to one another may be arranged in the second direction (e.g., x-direction).

In order to increase the lifespan of the display device, it may be necessary to increase the area of the third opening 119OP3, and thus, the third opening 119OP3 may include a concave portion 119g adjacent to the third connection part CNT3. An area of the third opening 119OP3 may be greater than that of the first opening 119OP1 and/or the second opening 119OP2.

A length from one edge of the third opening 119OP3 to the concave portion 119g may vary depending on a location of the third opening 119OP3 in the display device.

In an embodiment, from among four third openings 119OP3 configuring one opening group, a first length l1 from a first edge of the first third opening 119OP3 to the concave portion 119g may be less than a second length l2 from a first edge of the second third opening 119OP3 to the concave portion 119g. A third length l3 from a first edge of the third third opening 119OP3 to the concave portion 119g may be less than a fourth length l4 from a first edge of the fourth third opening 119OP3 to the concave portion 119g. The third length l3 may be greater than the second length l2.

Because the concave portion 119g may be adjacent to the third connection part CNT3, a length (e.g., first to fourth lengths) from one edge of the third opening 119OP3 to the concave portion 119g may correspond to a length from one edge of the third opening 119OP3 to the third connection part CNT3.

Figure 10:
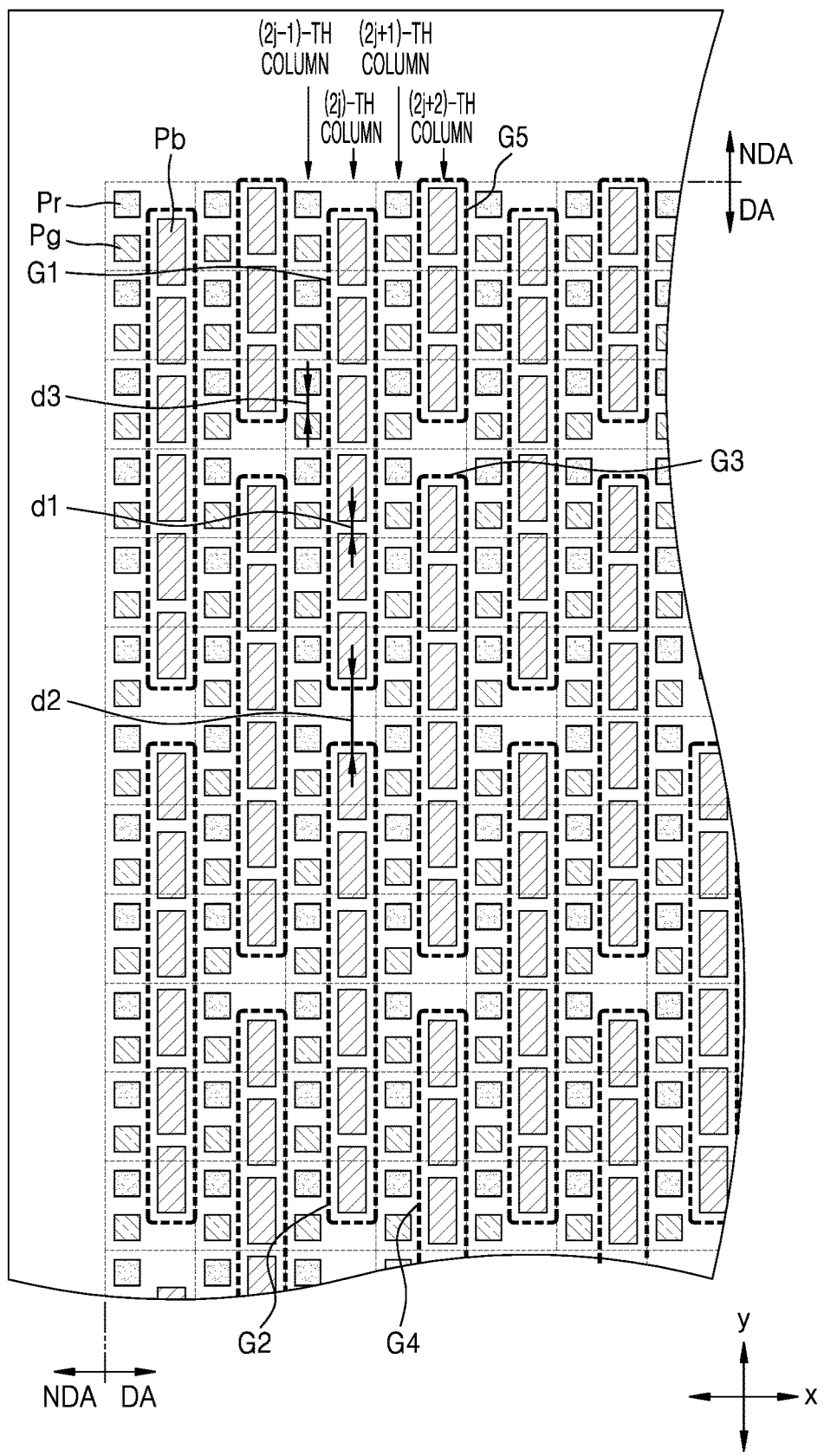
FIG. 10 is a schematic plan view showing the arrangement of pixels in a display device according to an embodiment.

FIG. 10 is a schematic plan view showing the arrangement of pixels in a display device according to an embodiment.

Referring to FIG. 10, an array of pixels may include columns (or pixel columns) arranged in the first direction (e.g., y-direction). From among the first to third pixels, the first and second pixels may be in the same column, and the third pixel may be in a different column.

The array of the pixels may include the (2j−1)-th column including the red pixels Pr and the green pixels Pg that may be alternately arranged in the first direction, the (2j)-th column including the blue pixels Pb arranged in the first direction, the (2j+1)-th column including the red pixels Pr and the green pixels Pg arranged alternately in the first direction, and the (2j+2)-th column including the blue pixels Pb arranged in the first direction (here, j may be 1 or greater odd-number). The array of the pixels may have a structure, in which the (2j−1)-th column, the (2j)-th column, the (2j+1)-th column, and the (2j+2)-th column may be repeatedly arranged.

The (2j−1)-th column and the (2j+1)-th column may each include the red pixels Pr and the green pixels Pg that may be alternately arranged in the first direction, and detailed structure thereof are described above.

The (2j)-th column and the (2j+1)-th column may each have a structure, in which groups including n blue pixels Pb (n may be 4 or greater even-number) may be arranged in the first direction. In some embodiments, FIG. 6 shows that six blue pixels Pb may be arranged adjacent to one another. The six blue pixels Pb arranged adjacent to one another may configure one group. The first distance d1 between the adjacent blue pixels Pb in one group may be less than the second distance d2 between adjacent groups.

For example, the first distance d1 among the blue pixels Pb included in the first group G1 may be less than the second distance d2 between the first group G1 and the second group G2. Similarly, the first distance d1 between adjacent blue pixels Pb in the third group G3 may be less than the second distance d2 between the third group G3 and the fourth group G4.

The arrangement of the blue pixels Pb in the (2j+2)-th column may correspond to shifting of the arrangement of the blue pixels Pb in the (2j)-th column by about (n/2) pixels in the first direction. For example, groups of blue pixels in the (2j+2)-th column and groups of blue pixels in the (2j)-th column may be offset with respect to each other. The groups in the (2j+2)-th column may be arranged in a direction inclined with respect to the first and second directions, as compared with the groups in the (2j)-th column. For example, some of the blue pixels Pb of the third group G3 in the (2j+1)-th column correspond to the blue pixels Pb of the first group G1 in the second column, and the other blue pixels Pb of the third group G3 may correspond to the blue pixels Pb of the second group G2 in the second column. In other words, the groups each including n blue pixels Pb may be arranged in zig-zags in the second direction (e.g., x-direction).

The (2j+1)-th column may include the fifth group G5 adjacent to the non-display area NDA. In some embodiments, FIG. 10 shows that the fifth group G5 at the edge of the (2j+1)-th column includes three blue pixels Pb.

FIG. 10 shows that the (2j)-th column and the (2j+1)-th column each include groups including six blue pixels Pb, but in another embodiment, the (2j)-th column and the (2j+1)-th column may each have a structure, in which eight, ten, etc. blue pixels Pb may be arranged adjacent to one another.

Figure 11:
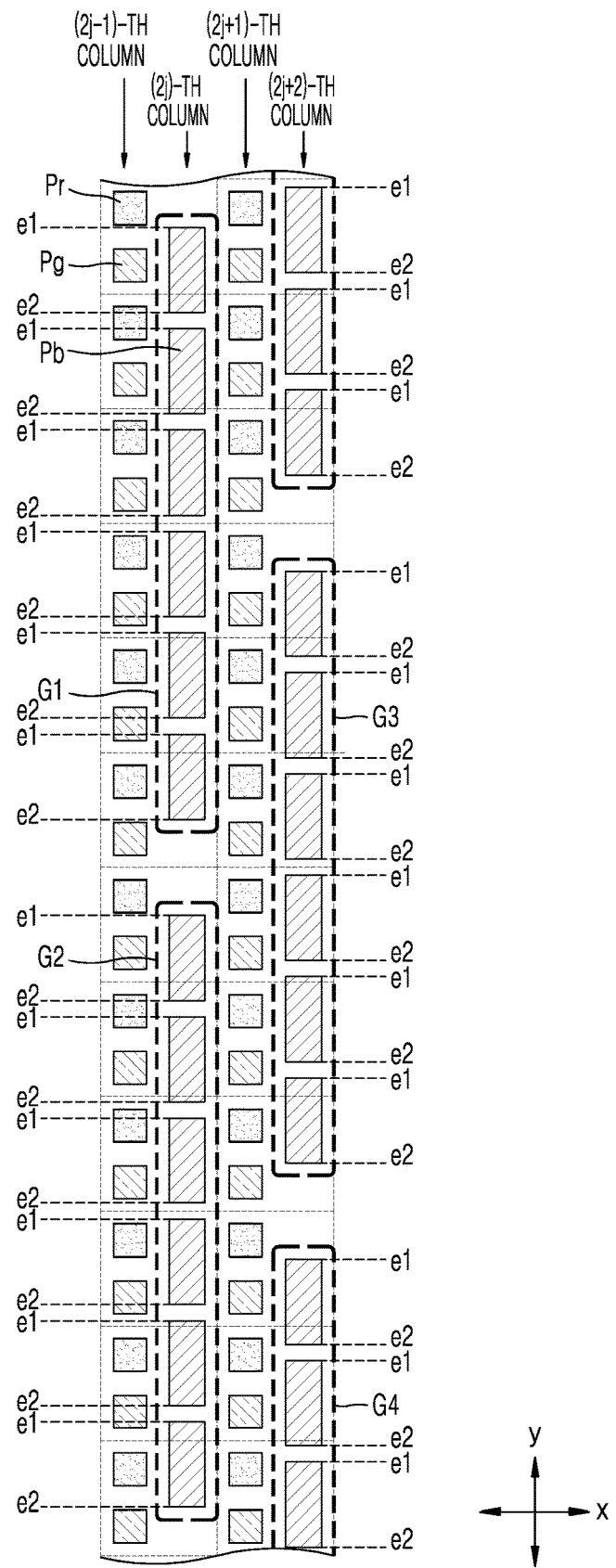
FIG. 11 is a schematic plan view partially showing the pixels of FIG. 10.

FIG. 11 is a schematic plan view partially showing the pixels of FIG. 10.

In the (2j)-th column and/or the (2j+2)-th column, the green pixel Pg (or red pixel) may be located within a range between opposite edges in each of first to (n/2)-th blue pixels Pb. The red pixel Pr (or green pixel) may be located within a range between opposite edges in each of the (n/2+1)-th to n-th blue pixels Pb in each group.

Referring to the (2j)-th column of FIG. 11, the first blue pixel Pb in each of the first and second groups G1 and G2 may include the first edge e1 and the second edge e2. The red pixel Pr adjacent to the first blue pixel Pb may be out of the range between the first edge e1 and the second edge e2 of the first blue pixel Pb, and the green pixel Pg adjacent to the first blue pixel Pb may be located within the range between the first edge e1 and the second edge e2 of the first blue pixel Pb.

Similarly, the second and third blue pixels Pb in each of the first group G1 and the second group G2 may each include the first edge e1 and the second edge e2, and the green pixel Pg may be located within a range between the first edge e1 and the second edge e2 in each of the second and third blue pixels Pb.

The fourth blue pixel Pb in each of the first group G1 and the second group G2 includes the first edge e1 and the second edge e2, and the red pixel Pr may be located within a range between the first edge e1 and the second edge e2 of the fourth blue pixel Pb.

Similarly, the fifth and sixth blue pixels Pb in each of the first group G1 and the second group G2 may each include the first edge e1 and the second edge e2, and the red pixel Pr may be located within a range between the first edge e1 and the second edge e2 in each of the fifth and sixth blue pixels Pb.

Referring to the (2j+2)-th column of FIG. 11, the blue pixel Pb in each of the third and fourth groups G3 and G4 may include the first edge e1 and the second edge e2.

In the third and fourth groups G3 and G4, the green pixel Pg may be located within a range between the first edge e1 and the second edge e2 in each of the first to third blue pixels Pb. In the third and fourth groups G3 and G4, the red pixel Pr may be located within a range between the first edge e1 and the second edge e2 in each of the fourth to sixth blue pixels Pb.

In the embodiments described above with reference to FIGS. 4 to 11, the first pixel may be the red pixel and the second pixel may be the green pixel, but in another embodiment, the first pixel may be the green pixel and the second pixel may be the red pixel.

According to one or more embodiments, the pixels may be effectively arranged, including the improvement of the aperture ratio. However, the above technical features are exemplary, and the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims including any equivalents.

What is claimed is:

1. A display device comprising:
    a substrate; and
    an array of pixels on the substrate, the array of the pixels defined by a pixel defining layer and comprising:
        a first column in which first pixels emitting first color light and second pixels emitting second color light are alternately disposed in a first direction;
        a second column adjacent to the first column, the second column comprising third pixels that emit third color light and are disposed in the first direction; and
    a first light-emitting diode, a second light-emitting diode, and a third light-emitting diode respectively corresponding to a first pixel of the first pixels a second pixel of the second pixels, and a third pixel of the third pixels, wherein
    the second column includes groups each including two or more third pixels,
    a first distance between adjacent third pixels included in a same group is less than a second distance between adjacent third pixels included in different groups,
    the pixel defining layer includes:
        a first portion extending between the adjacent third pixels included in the same group, and
        a second portion extending between the adjacent third pixels included in the different groups,
    each of the first light-emitting diode, the second light-emitting diode, and the third light emitting diode comprises a pixel electrode, and
    an emission layer which overlaps a pixel electrode of the third light emitting diode overlaps another third electrode of another third light-emitting diode corresponding another third pixel in the same group.

2. The display device of claim 1, wherein the two or more third pixels include an even number of third pixels.

3. The display device of claim 1, wherein the two or more third pixels include at least four third pixels.

4. The display device of claim 1, wherein
    each of the groups in the second column comprises a first third pixel and a second third pixel disposed sequentially in the first direction,
    a second pixel of the first column is disposed between opposite edges of the first third pixel, the opposite edges being at opposite sides of the first third pixel in the first direction, and
    another second pixel of the first column is disposed between opposite edges of the second third pixel, the opposite edges being at opposite sides of the second third pixel in the first direction.

5. The display device of claim 4, wherein
    each of the groups in the second column comprises a third pixel and another third pixel disposed sequentially and adjacent to each other,
    a first pixel of the first column is disposed between opposite edges of the third pixel, the opposite edges being at opposite sides of the third pixel in the first direction, and
    another first pixel of the first column is disposed between opposite edges of the another third pixel, the opposite edges being at opposite sides of the another third pixel in the first direction.

6. The display device of claim 1, wherein a third distance between a first pixel and a second pixel adjacent to each other in the first column is greater than the first distance and less than the second distance.

7. The display device of claim 1, wherein the array of the pixels comprises:
    a third column adjacent to the second column, the third column comprising the first and second pixels that are alternately disposed in the first direction; and
    a fourth column adjacent to the third column, the fourth column comprising the third pixels that emit third color light and are disposed in the first direction.

8. The display device of claim 7, wherein
    a first pixel in the first column and a first pixel in the third column are disposed in a first row direction that is in a second direction perpendicular to the first direction,
    a second pixel in the first column and a second pixel in the third column are disposed in a second row direction that is in the second direction,
    the fourth column includes groups each including two or more third pixels, and
    the groups in the fourth column and the groups in the second column are offset with respect to each other.

9. The display device of claim 7, wherein the fourth column further comprises a group disposed at an edge of the fourth column and including half as many third pixels as another group of the fourth column.

10. The display device of claim 1 wherein the emission layer of the third light-emitting diode extends in the first direction.

11. The display device of claim 1, further comprising:
    pixel circuits electrically connected to the first light-emitting diode, the second light-emitting diode, and the third light-emitting diode;
    a first connection part between the pixel electrode of the first light-emitting diode and a corresponding pixel circuit; and
    a second connection part between the pixel electrode of the second light-emitting diode and a corresponding pixel circuit,
    wherein the first connection part and the second connection part are disposed between the first pixel and the second pixel.

12. The display device of claim 11, further comprising a third connection part between the pixel electrode of the third light-emitting diode and a corresponding pixel circuit, wherein the first and second connection parts are disposed at a first side with respect to a virtual line, which passes the pixel electrode of the third light-emitting diode and extends in a column direction, and the third connection part is disposed at the first side with respect to the virtual line and is adjacent to the first pixel and the second pixel.

13. The display device of claim 1, wherein
one of the first pixel and the second pixel includes a red pixel and the other of the first pixel and the second pixel includes a green pixel, and
the third pixel includes a blue pixel.

14. The display device of claim 1, wherein an aperture ratio of each of the third pixels is greater than an aperture ratio of each of the first and second pixels.

15. A display device comprising:
a substrate;
pixel electrodes disposed on the substrate;
a pixel defining layer disposed on the pixel electrodes, the pixel defining layer comprising openings overlapping the pixel electrodes;
first emission layers, second emission layers, and third emission layers that are disposed on the pixel defining layer; and
an opposite electrode disposed on the first, second, and third emission layers, wherein
the openings in the pixel defining layer comprise:
a first column comprising first openings and second openings that are alternately disposed in a first direction; and
a second column adjacent to the first column, the second column comprising third openings disposed in the first direction,
the second column comprising:
a first opening group comprising third openings; and
a second opening group disposed adjacent to the first opening group in the first direction, the second opening group comprising third openings,
a first distance between adjacent third openings in the first opening group is less than a second distance between the first opening group and the second opening group, and
the pixel defining layer includes:
a first portion between two third openings that are adjacent to each other and overlap one of the third emission layers; and
a second portion between two third openings that are adjacent to each other, one of the two third openings overlapping one of the third emission layers and the other third opening overlapping another one of the third emission layers.

16. The display device of claim 15, wherein
the first emission layers respectively overlap the first openings,
the second emission layers respectively overlap the second openings,
the third emission layers are apart from one another in the first direction, and
each of the third emission layers overlaps corresponding ones of the third openings.

17. The display device of claim 16, wherein
the first emission layers include red emission layers emitting red light,
the second emission layers include green emission layers emitting green light, and
the third emission layers include blue emission layers emitting blue light.

18. The display device of claim 15, wherein
a width of the first portion of the pixel defining layer in the first direction is less than a width of the second portion of the pixel defining layer in the first direction.

19. The display device of claim 18, wherein
the pixel defining layer includes a third portion between the first opening and the second opening that are adjacent to each other and respectively overlap the first and second emission layers, and
a width of the third portion is greater than the width of the first portion and less than the width of the second portion.

20. The display device of claim 15, wherein
each of the third openings comprises opposite edges at opposite sides in the first direction,
a second opening of the first column overlaps the second emission layer and is disposed between opposite edges of a first third opening included in the first opening group or the second opening group, and
another second opening of the first column overlaps the second emission layer and is disposed between opposite edges of a second third opening included in the first opening group or the second opening group.

21. The display device of claim 20, wherein
a first opening of the first column overlaps the first emission layer and is disposed between opposite edges of a third opening included in the first opening group or the second opening group, and
another first opening of the first column overlaps the first emission layer and is disposed between opposite edges of another third opening included in the first opening group or the second opening group.

22. The display device of claim 15, wherein
the openings in the pixel defining layer comprise:
a third column adjacent to the second column, the third column including first openings and second openings that are alternately disposed in the first direction; and
a fourth column adjacent to the third column, the fourth column comprising third openings disposed in the first direction,
the fourth column includes opening groups each including two or more third openings, and
one of the opening groups in the fourth column and the first opening group in the second column are offset with respect to each other.

23. The display device of claim 15, further comprising pixel circuits electrically connected to the pixel electrodes,
wherein connection parts between the pixel electrodes overlapping the third openings of the second column and corresponding pixel circuits are adjacent to the first column.

24. The display device of claim 23, wherein a first length between an edge of one of the third openings of the second column and a corresponding connection part is different from a second length between an edge of a neighboring third opening and a corresponding connection part.

25. The display device of claim 23, wherein each of the third openings of the second column includes a concave portion adjacent to the first column.

26. The display device of claim 15, wherein an area of each of the third openings is greater than an area of each of the first openings or an area of each of the second openings.

* * * * *